United States Patent
Ohtou et al.

(10) Patent No.: US 10,522,459 B2
(45) Date of Patent: Dec. 31, 2019

(54) METHOD FOR FABRICATING SEMICONDUCTOR DEVICE HAVING BURIED METAL LINE

(71) Applicant: TAIWAN SEMICONDUCTOR MANUFACTURING CO., LTD., Hsinchu (TW)

(72) Inventors: Tetsu Ohtou, Hsinchu (TW); Yusuke Oniki, Hsinchu (TW); Hidehiro Fujiwara, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/234,934

(22) Filed: Dec. 28, 2018

(65) Prior Publication Data

US 2019/0139891 A1    May 9, 2019

Related U.S. Application Data

(62) Division of application No. 15/453,963, filed on Mar. 9, 2017, now Pat. No. 10,170,413.

(Continued)

(51) Int. Cl.
| | |
|---|---|
| *H01L 21/8234* | (2006.01) |
| *H01L 23/522* | (2006.01) |
| *H01L 23/532* | (2006.01) |
| *H01L 23/528* | (2006.01) |
| *H01L 27/092* | (2006.01) |
| *H01L 29/06* | (2006.01) |
| *H01L 21/8238* | (2006.01) |

(Continued)

(52) U.S. Cl.
CPC ........ *H01L 23/5228* (2013.01); *H01L 21/743* (2013.01); *H01L 21/823814* (2013.01); *H01L 21/823821* (2013.01); *H01L 21/823828* (2013.01); *H01L 21/823871* (2013.01); *H01L 21/823878* (2013.01); *H01L 23/5286* (2013.01); *H01L 23/5329* (2013.01); *H01L 23/53257* (2013.01); *H01L 27/0924* (2013.01); *H01L 29/0649* (2013.01); *H01L 29/66545* (2013.01); *H01L 27/1104* (2013.01)

(58) Field of Classification Search
CPC ..... H01L 21/823418; H01L 21/823431; H01L 21/823814; H01L 21/823821
See application file for complete search history.

(56) References Cited

U.S. PATENT DOCUMENTS

| | | | |
|---|---|---|---|
| 4,977,439 A | 12/1990 | Esquivel et al. | |
| 10,170,413 B2 * | 1/2019 | Ohtou | ................. H01L 23/5228 |

* cited by examiner

*Primary Examiner* — Mark V Prenty
(74) *Attorney, Agent, or Firm* — McClure, Qualey & Rodack, LLP

(57) ABSTRACT

A method includes etching a semiconductor substrate to form a fin. An isolation structure is formed over the semiconductor substrate and around the fin. The isolation structure and the semiconductor substrate are etched to form a recess. A barrier layer is deposited over a bottom surface and a sidewall of the recess. A conductive layer is deposited over the barrier layer. The conductive layer is recessed to form a conductive line, in which a top surface of the conductive line is lower than a top surface of the isolation structure. A dielectric cap layer is formed over the conductive line. The isolation structure and the dielectric cap layer are recessed, such that the fin protrudes from the recessed isolation structure.

20 Claims, 17 Drawing Sheets

Related U.S. Application Data

(60) Provisional application No. 62/426,675, filed on Nov. 28, 2016.

(51) Int. Cl.
*H01L 29/66* (2006.01)
*H01L 21/74* (2006.01)
*H01L 27/11* (2006.01)

METHOD FOR FABRICATING SEMICONDUCTOR DEVICE HAVING BURIED METAL LINE

RELATED APPLICATIONS

This application is a Divisional of U.S. application Ser. No. 15/453,963, filed Mar. 9, 2017, now U.S. Pat. No. 10,170,413, issued Jan. 1, 2019, which claims priority to U.S. Provisional application Ser. No. 62/426,675, filed Nov. 28, 2016, all of which are incorporated herein by reference in their entirety.

BACKGROUND

Semiconductor devices in advanced fabrication technology have been researched and developed, leading to an aggressive scaling of standard cells and/or area scaling in the semiconductor devices. For example, metal pitch scaling is required in order to secure enough power and signal metal lines. However, it causes constraints on, for example, routing density or speed degradation, by a high parasitic resistance on the metal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
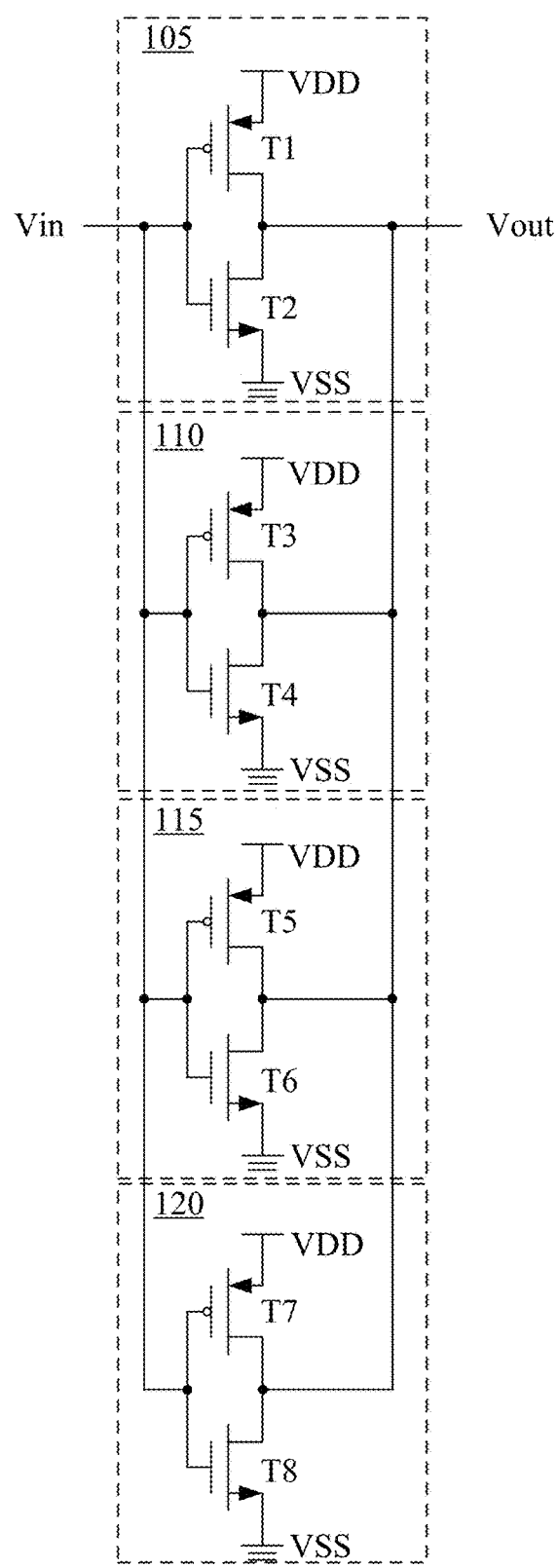
FIG. 1 is an exemplary circuit diagram of a semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1 is an exemplary circuit diagram of a semiconductor device 100 in accordance with various embodiments of the present disclosure.

In some embodiments, the semiconductor device 100 includes four inverters 105, 110, 115 and 120. For illustration, the inverter 105 includes transistors T1 and T2. The first source/drain of the transistor T1 is electrically coupled to a power supply VDD. The second source/drain of the transistor T1 is electrically coupled to the first source/drain of the transistor T2. The second source/drain of the transistor T2 is electrically coupled to a power supply VSS. In some embodiments, the term "source/drain" is referred to as a region that is either a source region or a drain region, in the present disclosure.

In some embodiments as shown in FIG. 1, the transistor T1 is a PMOS transistor, and the transistor T2 is an NMOS transistor. In such embodiments, the first and second source/drain of the transistor T1 are referred to as the source and drain of the transistor T1, respectively, and the first and second source/drain of the transistor T2 are referred to as the source and drain of the transistor T2, respectively.

For illustration of FIG. 1, the inverter 110 includes transistors T3 and T4. The first source/drain of the transistor T3 is electrically coupled to the power supply VDD. The second source/drain of the transistor T3 is electrically coupled to the first source/drain of the transistor T4. The second source/drain of the transistor T4 is electrically coupled to the power supply VSS.

For illustration of FIG. 1, the inverter 115 includes transistors T5 and T6. The first source/drain of the transistor T5 is electrically coupled to the power supply VDD. The second source/drain of the transistor T5 is electrically coupled to the first source/drain of the transistor T6. The second source/drain of the transistor T6 is electrically coupled to the power supply VSS.

For illustration of FIG. 1, the inverter 120 includes transistors T7 and T8. The first source/drain of the transistor T7 is electrically coupled to the power supply VDD. The second source/drain of the transistor T7 is electrically coupled to the first source/drain of the transistor T8. The second source/drain of the transistor T8 is electrically coupled to the power supply VSS.

In some embodiments as shown in FIG. 1, each one of the transistors T3, T5 and T7 is a PMOS transistor, and each one of the transistors T4, T6 and T8 is an NMOS transistor. The aforementioned types of the transistors T1-T8 are given for illustrative purposes. Various types of the transistors T1-T8 are within the contemplated scope of the present disclosure.

In some embodiments, the voltage of the power supply VSS is smaller than the voltage of the power supply VDD. In some embodiments, the voltage of the power supply VSS is a ground voltage. The relation and configurations of the voltages of the power supply VSS and the power supply VDD are given for illustrative purposes. Various relations and configurations of the voltages of the power supply VSS and the power supply VDD are within the contemplated scope of the present disclosure.

For further illustration of FIG. 1, the gates of the transistors T1-T8 are electrically coupled together to receive an input signal Vin. The second sources/drains of the transistors T1, T3, T5 and T7 and the first sources/drains of the transistors T2, T4, T6 and T8 are further electrically coupled together to generate an output signal Vout.

The number and the configuration of the transistors in the semiconductor device 100 in FIG. 1 are given for illustrative purposes. Various numbers and the configurations of the transistors in the semiconductor device 100 are within the contemplated scope of the present disclosure.

Figure 2A:
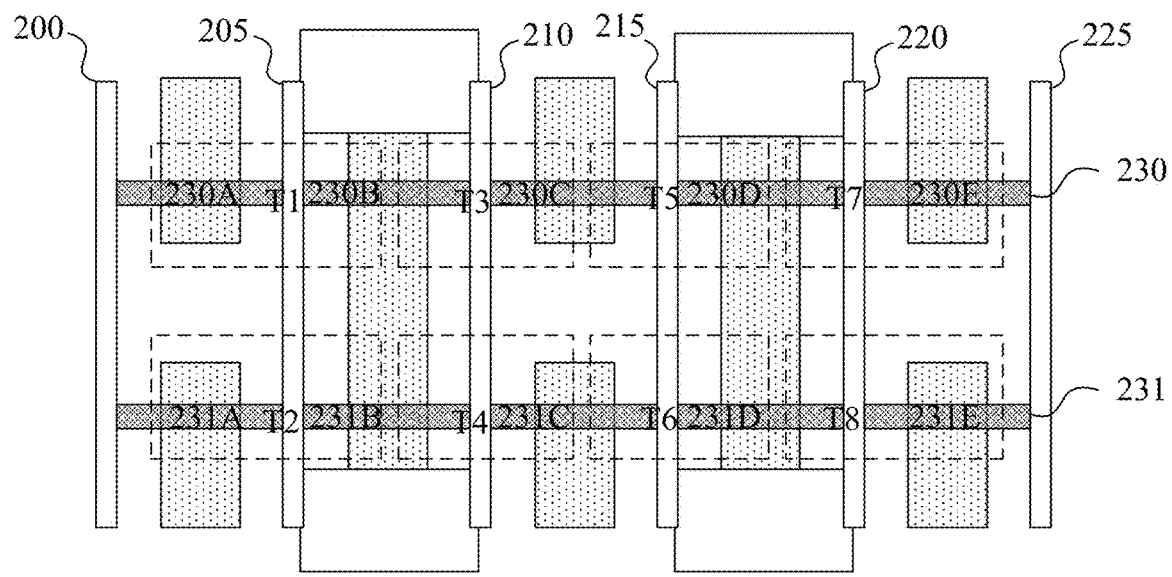
FIG. 2A is an exemplary partial layout diagram of the semiconductor device in FIG. 1, in accordance with various embodiments of the present disclosure.

FIG. 2A is an exemplary partial layout diagram of the semiconductor device 100 in FIG. 1, in accordance with various embodiments of the present disclosure. With respect to the embodiments of FIG. 2A, like elements in FIG. 1 are designated with the same reference numbers for ease of understanding.

Components of the semiconductor device 100 in FIG. 2A, as will be illustrated below, are disposed, in some embodiments, over a semiconductor substrate, which, for convenience of illustration, is not shown in FIG. 2A. In some embodiments, the semiconductor substrate is a silicon substrate or other suitable semiconductor substrate.

For illustration in FIG. 2A, the semiconductor device 100 includes the transistors T1-T8 illustrated in FIG. 1. Each one of the transistors T1-T8 is indicated by a dashed line frame in FIG. 2A.

For illustration in FIG. 2A, the semiconductor device 100 includes gates 200, 205, 210, 215, 220 and 225. The gate 205 is configured as the gates of the transistors T1 and T2 as illustrated in FIG. 1. The gate 210 is configured as the gates of the transistors T3 and T4 as illustrated in FIG. 1. The gate 215 is configured as the gates of the transistors T5 and T6 as illustrated in FIG. 1. The gate 220 is configured as the gates of the transistors T7 and T8 as illustrated in FIG. 1.

In some embodiments, the gates 200, 205, 210, 215, 220 and 225 are formed of polysilicon. Accordingly, the term "gate" with respect to the reference numbers 200, 205, 210, 215, 220 and 225 is also referred to as "PO" in some embodiments. Various conductive materials used to form the gates 200, 205, 210, 215, 220 and 225 are within the contemplated scope of the present disclosure. For example, in various embodiments, the gates 200, 205, 210, 215, 220 and 225 are formed of metals, metal alloys, metal silicides, or the like.

In some embodiments, the semiconductor device 100 further includes fin structures 230 and 231, as illustrated in FIG. 2A. In some embodiments, the fin structures 230 and 231 are arranged to form sources/drains of the transistors T1-T8.

In some embodiments, the fin structures 230 and 231 are each formed in an active region (not shown). In some embodiments, the term "active region" discussed in the present disclosure is also referred to as "OD" (oxide dimensioned area). In some embodiments, the fin structure 230 is formed in a P-type active region, and the fin structure 231 is formed in an N-type active region. The P-type active region is provided for the formation of PMOS transistors, and the N-type active region is provided for the formation of NMOS transistors. The above types of the active regions are given for illustrative purposes. Various types of the active regions are within the contemplated scope of the present disclosure.

The number and the configuration of the fin structures in FIG. 2A are given for illustrative purposes. Various numbers and configurations of the fin structures are within the contemplated scope of the present disclosure.

For illustration of FIG. 2A, the fin structure 230 includes fin components 230A-230E. The fin structure 231 includes fin components 231A-231E.

The fin component 230A corresponds to the first source/drain of the transistor T1, and the fin component 230B corresponds to the second source/drain of the transistor T1. Alternatively stated, the fin component 230A, the gate 205 and the fin component 230B together correspond to the transistor T1.

The fin component 231B corresponds to the first source/drain of the transistor T2, and the fin component 231A corresponds to the second source/drain of the transistor T2. Alternatively stated, the fin component 231B, the gate 205 and the fin component 231A together correspond to the transistor T2. In an alternative embodiment, the fin structure can also be served as a component of the channel for a nanowire fin-shaped field-effect transistor (FinFet), a nanosheet FinFet, a silicon-on-insulator (SOI) FinFet, a gate-all-around FinFet, an omega FinFet or a quad-gate FinFet.

The fin component 230C corresponds to the first source/drain of the transistor T3, and the fin component 230B corresponds to the second source/drain of the transistor T3. Alternatively stated, the fin component 230C, the gate 210 and the fin component 230B together correspond to the transistor T3.

The fin component 231B corresponds to the first source/drain of the transistor T4, and the fin component 231C corresponds to the second source/drain of the transistor T4. Alternatively stated, the fin component 231B, the gate 210 and the fin component 231C together correspond to the transistor T4.

The fin component 230C corresponds to the first source/drain of the transistor T5, and the fin component 230D corresponds to the second source/drain of the transistor T5. Alternatively stated, the fin component 230C, the gate 215 and the fin component 230D together correspond to the transistor T5.

The fin component 231D corresponds to the first source/drain of the transistor T6, and the fin component 231C corresponds to the second source/drain of the transistor T6. Alternatively stated, the fin component 231D, the gate 215 and the fin component 231C together correspond to the transistor T6.

The fin component 230E corresponds to the first source/drain of the transistor T7, and the fin component 230D corresponds to the second source/drain of the transistor T7. Alternatively stated, the fin component 230E, the gate 220 and the fin component 230D together correspond to the transistor T7.

The fin component 231D corresponds to the first source/drain of the transistor T8, and the fin component 231E corresponds to the second source/drain of the transistor T8. Alternatively stated, the fin component 231D, the gate 220 and the fin component 231E together correspond to the transistor T8.

Figure 2B:
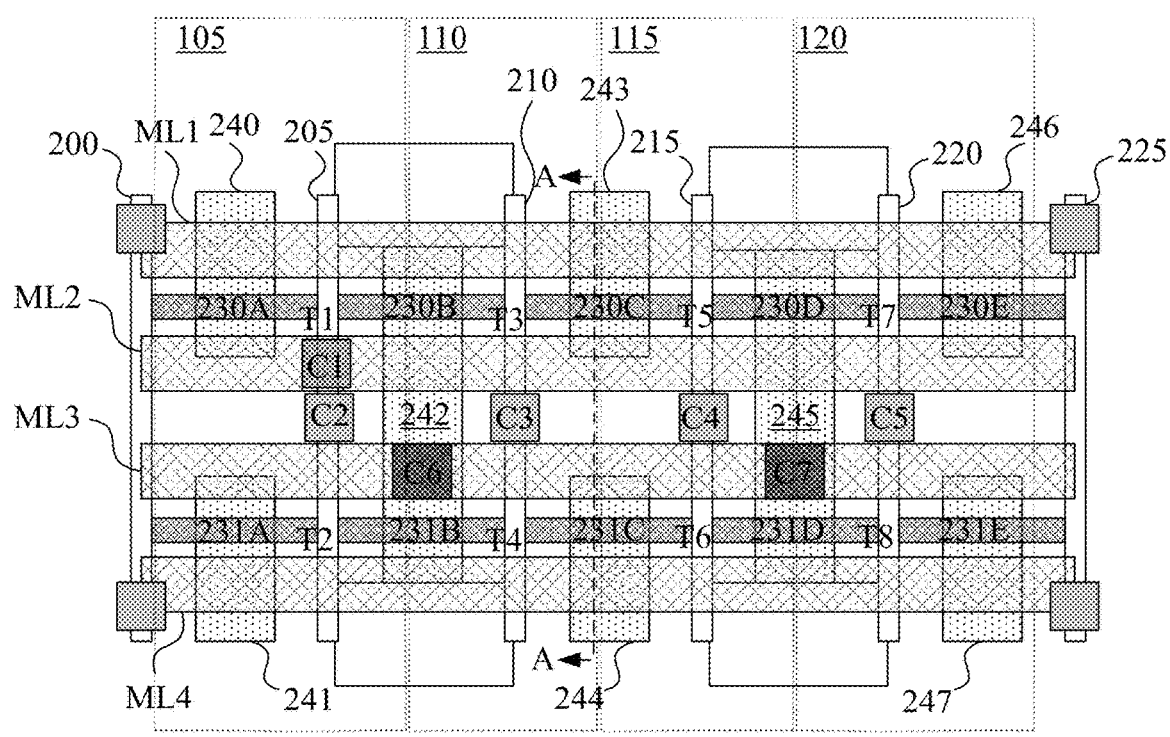
FIG. 2B and FIG. 2C are exemplary partial layout diagrams of the semiconductor device in FIG. 2A with interconnections in accordance with various embodiments of the present disclosure.
Figure 2C:
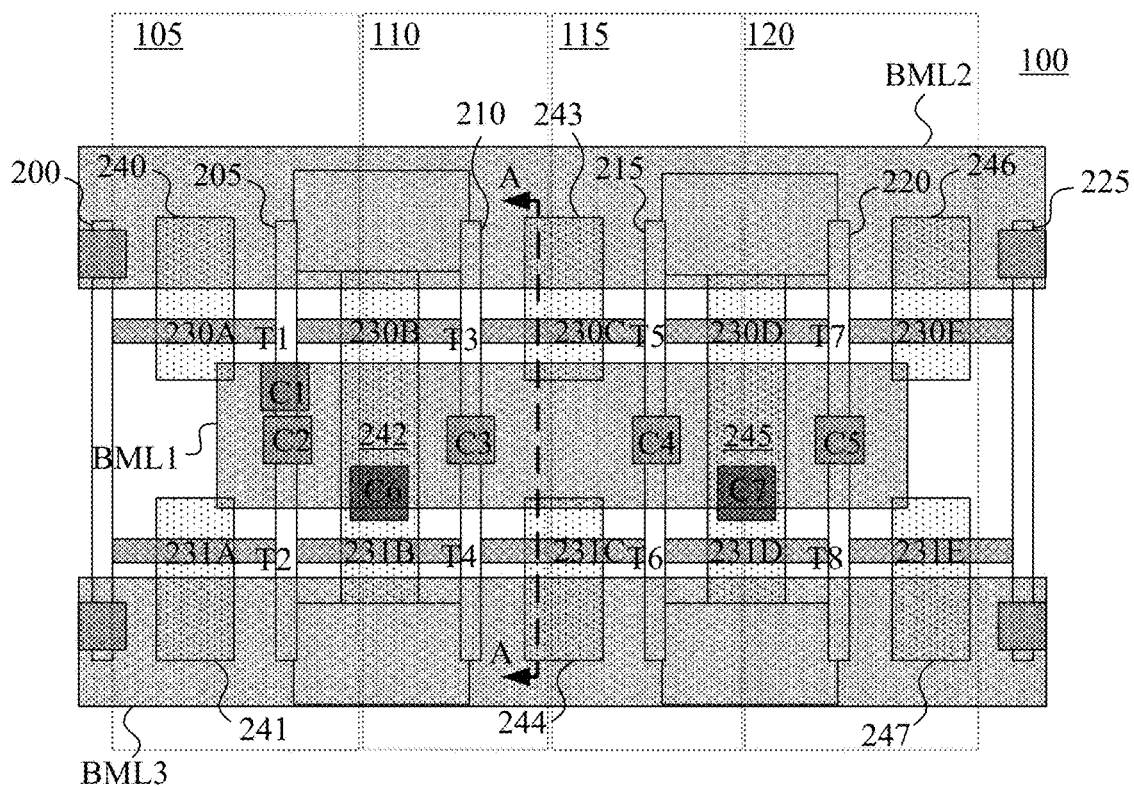

FIG. 2B and FIG. 2C are exemplary partial layout diagrams of the semiconductor device 100 in FIG. 2A with interconnections, in accordance with various embodiments of the present disclosure.

With respect to the embodiments of FIG. 2A, like elements in FIG. 2B and FIG. 2C are designated with the same reference numbers for ease of understanding. As illustrated in FIG. 2B and FIG. 2C, for simplicity, the transistors T1-T8 of the semiconductor device 100 are only labeled as T1-T8 at the respective gate, without the dashed line frames.

For illustration in FIG. 2B and FIG. 2C, the interconnections include local interconnections 240-247. In some embodiments, each of the local interconnections 240-247 is a metal segment.

For illustration, the local interconnection 242 electrically couples the fin component 230B to the fin component 231B. More specifically, the local interconnection 242 electrically couples the second sources/drains of the transistors T1 and T3 to the first sources/drains of the transistor T2 and T4. Alternatively stated, the transistors T1 and T2 are electrically coupled to each other through the local interconnection 242 to form the inverter 105. The transistors T3 and T4 are electrically coupled to each other through the local interconnection 242 to form the inverter 110.

Correspondingly, the local interconnection 245 electrically couples the fin component 230D to the fin component 231D. More specifically, the local interconnection 245 electrically couples the second sources/drains of the transistors T5 and T7 to the first sources/drains of the transistor T6 and T8. Alternatively stated, the transistors T5 and T6 are electrically coupled to each other through the local interconnection 245 to form the inverter 115. The transistors T7 and T8 are electrically coupled to each other through the local interconnection 245 to form the inverter 120.

In some embodiments, the interconnections further include top metal lines ML1-ML4 illustrated in FIG. 2B, buried metal lines BML1-BML3 illustrated in FIG. 2C, and contacts C1-C7. For simplicity of illustration, the top metal lines ML1-ML4 are only illustrated in FIG. 2B, and the buried metal lines BML1-BML3 are only illustrated in FIG. 2C. In a top-down sequence, the top metal lines ML1-ML4 are formed above, for example, the transistors T1-T8, while the buried metal lines BML1-BML3 are formed under the transistors T1-T8.

For illustration of FIG. 2B, the top metal line ML2 is electrically coupled to the gate 205 through the contact C1. For illustration of FIG. 2C, the buried metal line BML1 is electrically coupled to the gates 205, 210, 215, 220 through the contacts C2-C5, respectively. As a result, by using the buried metal line BML1, the gates of the transistors T1-T8 are electrically coupled together. The input signal Vin illustrated in FIG. 1 can be received by the gates of the transistors T1-T8, when, in view of FIGS. 2B and 2C, the input signal Vin is transmitted from the top metal line ML2, through the contact C1, the gate 205, the contact C2, the buried metal line BML1, and the contacts C3-C5, to the gates 210, 215, 220.

For illustration of FIG. 2B, the top metal line ML3 is electrically coupled to the local interconnections 242 and 245 through the contacts C6 and C7, respectively. As a result, by using the top metal line ML3, the fin components 230B, 231B, 230D and 231D are electrically coupled together. Correspondingly in FIG. 1, the second sources/drains of the transistors T1, T3, T5 and T7 and the first sources/drains of the transistor T2, T4, T6 and T8 are electrically coupled together. The output signal Vout illustrated in FIG. 1 can be generated from the second sources/drains of the transistors T1, T3, T5 and T7 and the first sources/drains of the transistor T2, T4, T6 and T8, when, in view of FIG. 2B, the output signal Vout is transmitted through any one of the contacts C6 and C7 to the top metal line ML3.

For illustration of FIG. 2C, the buried metal line BML2 is electrically coupled to the local interconnections 240, 243 and 246. Correspondingly in FIG. 1, the first sources/drains of the transistors T1, T3, T5 and T7 are electrically coupled together. In some embodiments, the buried metal line BML2 is further electrically coupled to the power supply VDD illustrated in FIG. 1, such that the first sources/drains of the transistors T1, T3, T5 and T7 receive the power supply VDD.

For illustration of FIG. 2C, the buried metal line BML3 is electrically coupled to the local interconnections 241, 244 and 247. Correspondingly in FIG. 1, the second sources/drains of the transistors T2, T4, T6 and T8 are electrically coupled together. In some embodiments, the buried metal line BML3 is further electrically coupled to the power supply VSS illustrated in FIG. 1, such that the second source/drains of the transistors T2, T4, T6 and T8 receive the power supply VSS.

Figure 3:
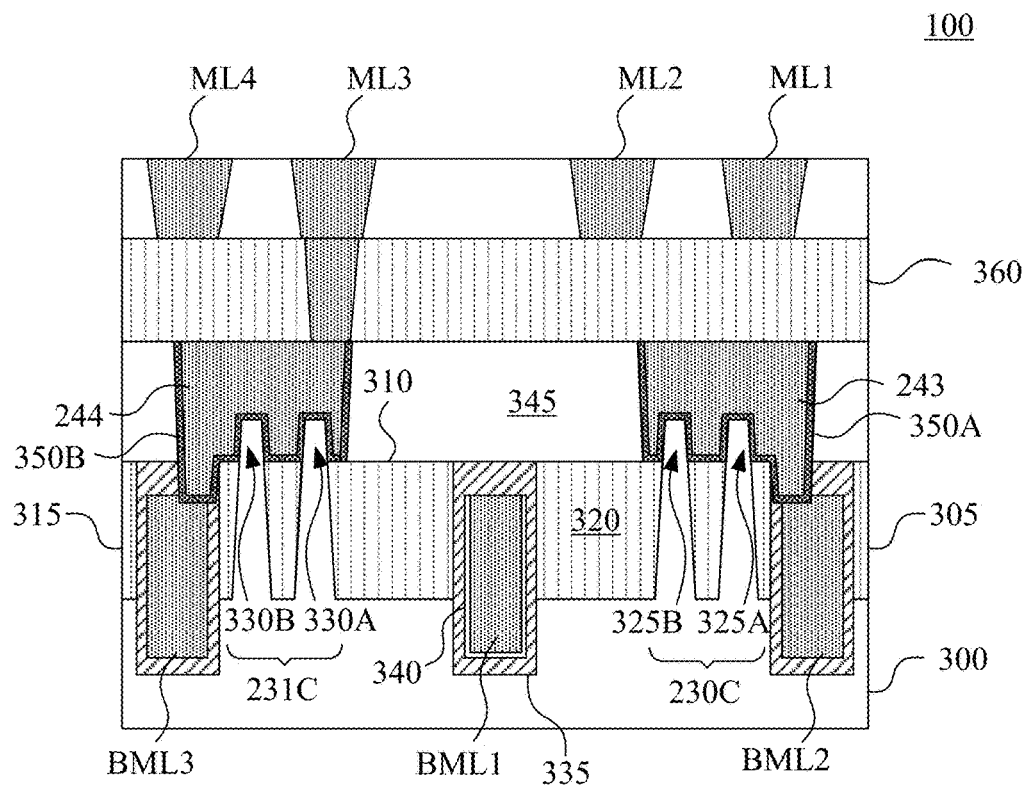
FIG. 3 is an exemplary cross-sectional diagram of the semiconductor device along the line A-A in FIG. 2B and FIG. 2C in accordance with various embodiments of the present disclosure.

FIG. 3 is an exemplary cross-sectional diagram of the semiconductor device 100 along the line A-A in FIG. 2B and FIG. 2C in accordance with various embodiments of the present disclosure. With respect to the embodiments of FIGS. 2B and 2C, like elements in FIG. 3 are designated with the same reference numbers for ease of understanding.

For illustration, the semiconductor device 100 includes a semiconductor substrate 300 and a shallow trench isolation (STI) structure that includes trenches 305, 310 and 315. In some embodiments, the trenches 305, 310 and 315 are filled with dielectric material 320. For illustration in FIG. 3, the trench 310 includes portions that are formed at opposite sides of the buried metal line BML1.

The fin component 230C is formed between the trenches 305 and 310. The fin component 231C is formed between the trenches 310 and 315. For illustration, the fin component 230C includes two fins 325A and 325B, and the fin component 231C includes two fins 330A and 330B. The number of fins in each of the fin components 230C and 231C is given for illustrative purposes. Various numbers of the fins in each of the fin components 230C and 231C are within the contemplated scope of the present disclosure.

In some embodiments, the buried metal lines BML1-BML3 are formed partially within the trenches 310, 305 and 315, respectively, as illustrated in FIG. 3. In some other embodiments, the buried metal lines BML1-BML3 are formed partially under the trenches 305, 310 and 315, respectively (not shown).

In some embodiments, the material of the buried metal lines BML1-BML3 includes low resistivity metallic material, including, for example, W, Ta, Ti or Al, and/or including, for example, the alloys, nitrides, silicides, doped-silicons or carbides thereof, e.g., TiAl, TaAl, TiAlC, WSix, TiSix, TaSix, CoSix, etc.

In some embodiments, the shape of a cross-section of at least one of the buried metal lines BML1-BML3 is rectangular, as illustrated in FIG. 3. The shape of the cross-section of the buried metal lines BML1-BML3 is given for illustrative purposes. Various shapes of the cross-section of the buried metal lines BML1-BML3 are within the contemplated scope of the present disclosure. For example, in various embodiments, the shape of the cross-section of at least one of the buried metal lines BML1-BML3 is rounded or triangular.

In some embodiments, a barrier layer 335 is formed to electrically isolate each of the buried metal lines BML1-BML3 from the semiconductor substrate 300 and the trenches 305, 310 and 315 that are filled with dielectric material 320. For simplicity, the barrier layer 335 is only labeled with respect to the buried metal line BML1. Moreover, the barrier layer 335 prevents the metal material of the buried metal lines BML1-BML3 from diffusing into the semiconductor substrate 300 and the trenches 305, 310 and 315. In some embodiments, the material of the barrier layer 335 includes SiOx, SiN, SiC, SiON, SiOC, SiONC, or a combination thereof.

In some embodiments, a glue layer 340 is selectively formed between the barrier layer 335 and the buried metal line, such as the buried metal line BML1, to enhance the adhering ability therebetween. In some embodiments, the material of the glue layer includes W, Ta, Ti, TiN, TaN, or a combination thereof.

The positions of the buried metal lines BML1-BML3 within the trenches 305, 310 and 315 are given for illustrative purposes. In some embodiments, depending on the requirements and different manufacturing processes, the buried metal lines BML1-BML3 are either formed fully in the trenches 310, 305 and 315, respectively, or fully under the trenches 310, 305 and 315. Various positions of the buried metal lines BML1-BML3 are within the contemplated scope of the present disclosure.

The local interconnections 243 and 244 are formed on the shallow trench isolation structure. For illustration, the local interconnection 243 is formed to cover the fin component 230C and the local interconnection 244 is formed to cover the fin component 231C. A portion of the local interconnection 243 extends to the trench 305 to be electrically coupled to the buried metal line BML2. A portion of the local interconnection 244 extends to the trench 315 to be electrically coupled to the buried metal line BML3.

In some embodiments, the semiconductor device 100 further includes an interlayer dielectric (ILD) portion 345 formed around the local interconnections 243 and 244 to provide electrical isolation between the local interconnections 243 and 244. In some embodiments, a layer of metal 350A is formed between the local interconnection 243 and neighboring portions, and a layer of metal 350B is formed between the local interconnection 244 and the neighboring portions. The neighboring portions include, for example, the dielectric material 320, the interlayer dielectric portion 345 and the fin components 230C and 231C.

In some embodiments, the semiconductor device 100 further includes a dielectric layer 360 over the local interconnections 243 and 244 and the interlayer dielectric portion 345. Further, the top metal lines ML1-ML4 are formed on the dielectric layer 360. In alternative embodiments, a portion of the top metal line ML3 extends through the dielectric layer 360 to be electrically coupled to the local interconnection 244, as illustrated in FIG. 3.

In some approaches, all the metal lines, including the power lines and the signal lines, are disposed above the components (e.g., STI structure and/or transistor) in the semiconductor device 100. In nowadays, the size of the semiconductor device gradually shrinks. Accordingly, when there are more metal lines, the space for routing with respect to the metal lines is limited. Moreover, the narrow pitch between each two of the metal lines may raise issues of the signal transmission therein because of the coupling effect between the metal lines. The density of the routing and the signal transmission of the metal lines are impacted.

Compared to the approaches discussed above, by employing the buried metal lines BML1-BML3 illustrated in the present disclosure, not all of the metal lines are necessarily disposed above the components (e.g., STI structure and/or transistor) in the semiconductor device 100. Alternatively stated, the number of metal lines that are formed above, for example, the STI structure and/or transistor, is able to be reduced. When there are fewer metal lines, such as the top metal lines ML1-ML4 as illustrated in FIG. 3, the pitch between each two of the top metal lines ML1-ML4 can be wider. As a result, under the same foot-print area, the performance of the signal transmission of the metal lines in the present disclosure is better than the performance of metal lines in other approaches discussed above.

Moreover, because the number of metal lines that are formed above, for example, the STI structure and/or transistor, is reduced, routing wires for the corresponding metal lines are reduced accordingly. As a result, the routing density of the metal lines in the semiconductor device 100 is improved.

Figure 4:
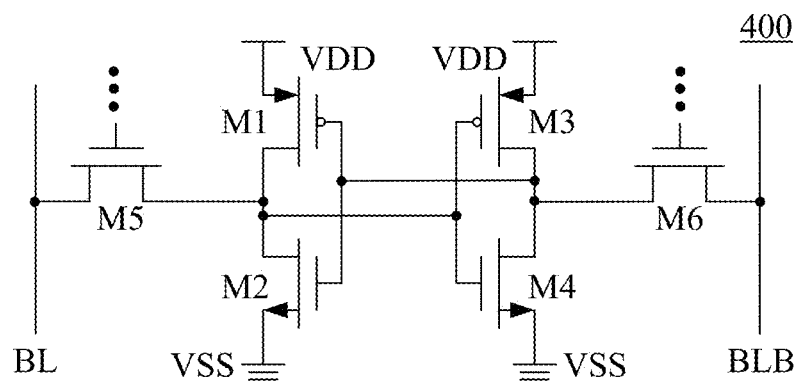
FIG. 4 is an exemplary circuit diagram of a semiconductor device in accordance with various embodiments of the present disclosure.

FIG. 4 is an exemplary circuit diagram of a semiconductor device 400 in accordance with various embodiments of the present disclosure. For illustration, the semiconductor device 400 includes six transistors M1-M6 operating as a memory device. First sources/drains of the transistors M1 and M3 are electrically coupled to a power supply VDD. Second sources/drains of the transistors M1 and M3 are electrically coupled to first sources/drains of the transistors M2 and M4, respectively. Second sources/drains of the transistors M2 and M4 are electrically coupled to a power supply VSS.

The gates of the transistors M1 and M2 are electrically coupled to the second source/drain of the transistor M3 and the first source/drain of the transistor M4. The gates of the transistors M3 and M4 are electrically coupled to the second source/drain of the transistor M1 and the first source/drain of the transistor M2.

The first source/drain of the transistor M5 is electrically coupled to the second source/drain of the transistor M1 and the first source/drain of the transistor M2. The second source/drain of the transistor M5 is electrically coupled to a bit line BL. The first source/drain of the transistor M6 is electrically coupled to the second source/drain of the transistor M3 and the first source/drain of the transistor M4. The second source/drain of the transistor M6 is electrically coupled to a bit line BLB.

Figure 5A:
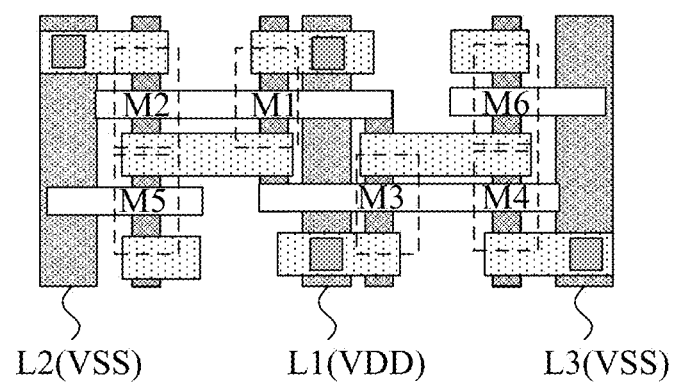
FIG. 5A is an exemplary layout diagram of the semiconductor device in FIG. 4, in accordance with various embodiments of the present disclosure.

FIG. 5A is an exemplary layout diagram of the semiconductor device 400 in FIG. 4, in accordance with various embodiments of the present disclosure. For illustration, each of the transistors M1-M6 is illustrated within a dashed line frame in FIG. 5A. With respect to the embodiments of FIG. 5A, like elements in FIG. 4 are designated with the same reference numbers for ease of understanding.

Components of the semiconductor device 400 in FIG. 5A, as will be illustrated below, are disposed, in some embodiments, over a semiconductor substrate, which, for convenience of illustration, is not shown in FIG. 5A. In some embodiments, the semiconductor substrate is a silicon substrate or other suitable semiconductor substrate.

As illustratively shown in FIG. 5A, the semiconductor device 400 further includes buried metal lines L1-L3. The buried metal line L1 is electrically coupled to the first sources/drains of the transistors M1 and M3 and is configured to receive the power supply VDD. The buried metal lines L2 and L3 are electrically coupled to the second sources/drains of the transistors M2 and M4 and are configured to receive the power supply VSS.

Figure 5B:
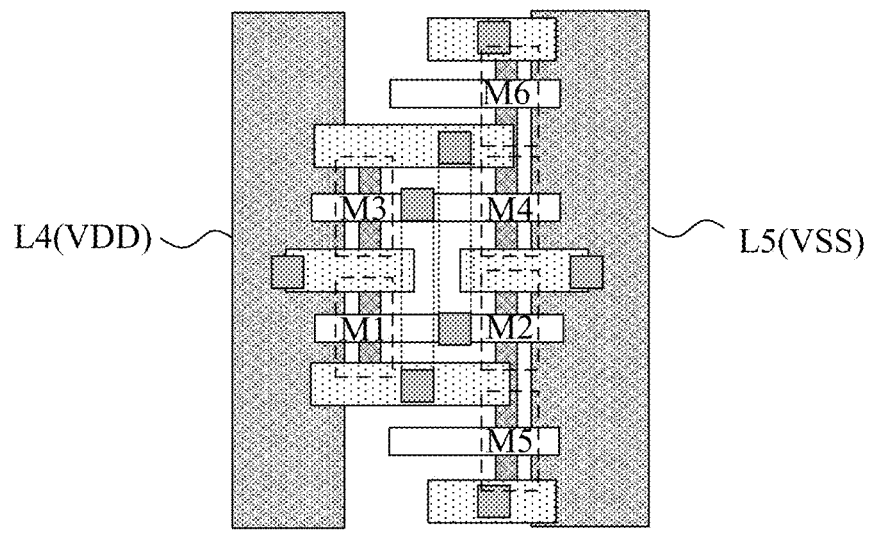
FIG. 5B is another exemplary layout diagram of the semiconductor device in FIG. 4, in accordance with various embodiments of the present disclosure.

FIG. 5B is another exemplary layout diagram of the semiconductor device 400 in FIG. 4, in accordance with various embodiments of the present disclosure. The layout geometry of the semiconductor device 400 in FIG. 5B is different from the geometry of the semiconductor device 400 in FIG. 5A.

For illustration, each of the transistors M1-M6 is illustrated within a dashed line frame in FIG. 5B. With respect to the embodiments of FIG. 5B, like elements in FIG. 4 are designated with the same reference numbers for ease of understanding.

As illustratively shown in FIG. 5B, the semiconductor device 400 includes buried metal lines L4-L5. The buried metal line L4 is electrically coupled to the first sources/drains of the transistors M1 and M3 and is configured to receive the power supply VDD. The buried metal line L5 are electrically coupled to one of the second sources/drains of the transistors M2 and M4 and is configured to receive the power supply VSS.

Figure 5C:
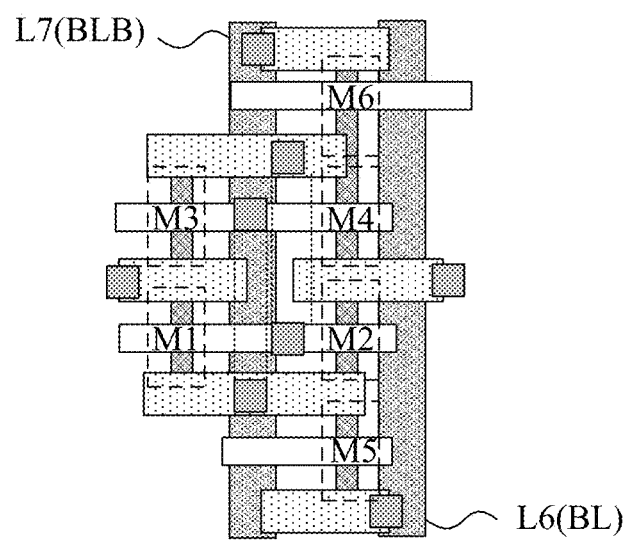
FIG. 5C is yet another exemplary layout diagram of the semiconductor device in FIG. 4, in accordance with various embodiments of the present disclosure.

FIG. 5C is yet another exemplary layout diagram of the semiconductor device 400 in FIG. 4, in accordance with various embodiments of the present disclosure. The layout geometry of the semiconductor device 400 in FIG. 5C is identical to the geometry of the semiconductor device 400 in FIG. 5B.

For illustration, each of the transistors M1-M6 is illustrated within a dashed line frame in FIG. 5C. With respect to the embodiments of FIG. 5C, like elements in FIG. 4 are designated with the same reference numbers for ease of understanding.

As illustratively shown in FIG. 5C, the semiconductor device 400 includes buried metal lines L6-L7. The buried metal line L6 is electrically coupled to the second source/drain of the transistor M5 and is operated as the bit line BL as illustrated in FIG. 4. The buried metal line L7 is electrically coupled to the second source/drain of the transistor M6 and is operated as the bit line BLB as illustrated in FIG. 4.

The semiconductor devices and the buried metal lines therein, as discussed above, are given for illustrative purposes. The buried metal lines can be applied to different kinds of semiconductor devices. Various kinds of semiconductor devices and the buried metal lines are within the contemplated scope of the present disclosure. For example, in various embodiments, the structures including the buried metal lines as illustrated in FIG. 3 are implemented in a standard cell including inverters, and the structures including the buried metal lines as illustrated in FIG. 5A to FIG. 5C are implemented in a memory device including a static random access memory (SRAM) cell.

Figure 6:
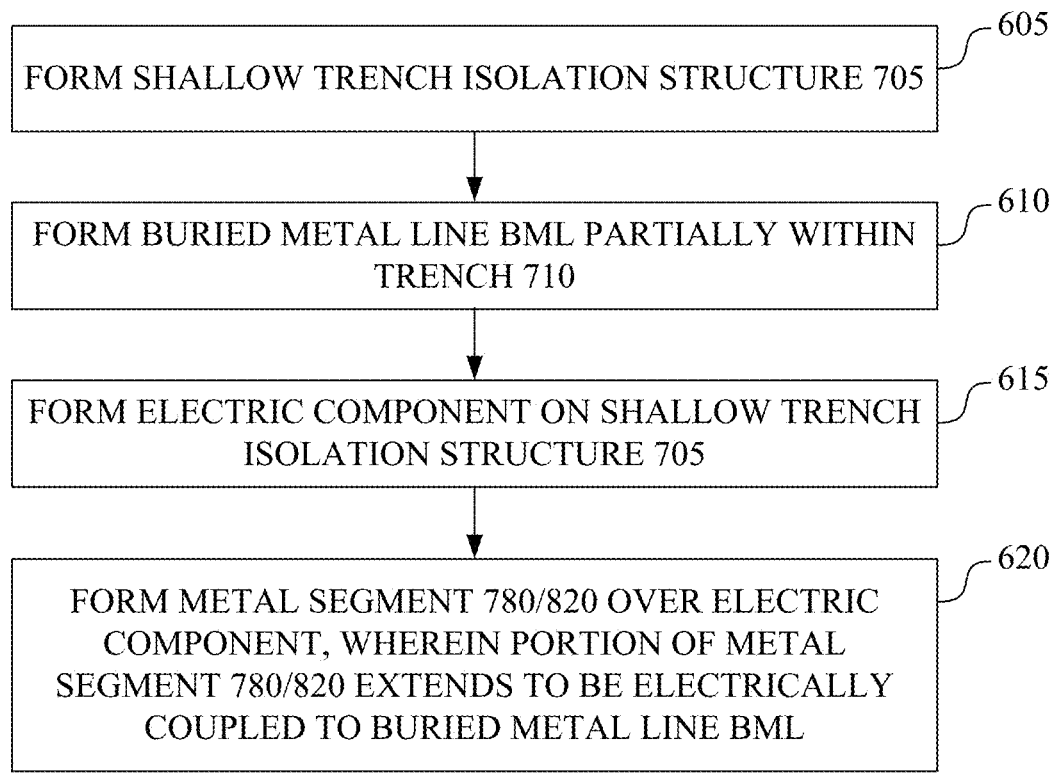
FIG. 6 is a flow chart of a method illustrating the fabrication process of a semiconductor device having a buried metal line in accordance with some embodiments of the present disclosure.

FIG. 6 is a flow chart of a method 600 illustrating a fabrication process of a semiconductor device having a buried metal line in accordance with some embodiments of the present disclosure.

FIGS. 7A-7F are exemplary cross-sectional diagrams of a first stage of the fabrication of a semiconductor device 700 in accordance with various embodiments of the present disclosure. FIGS. 8A-8E are exemplary cross-sectional diagrams of a second stage of the fabrication of the semiconductor device 700 in accordance with some embodiments of the present disclosure. FIGS. 9A-9D are exemplary cross-sectional diagrams of a second stage of the fabrication of the semiconductor device 700 in accordance with alternative embodiments of the present disclosure.

For illustration, the method 600 is applied to the semiconductor device 700 illustrated in FIGS. 7A-7F, 8A-8E, and 9A-9D. The method 600 discussed below with reference to FIGS. 7A-7F, 8A-8E, and 9A-9D is given for illustrative purposes. Various semiconductor devices formed by using the method 600 are within the contemplated scope of the present disclosure.

Figure 7A:
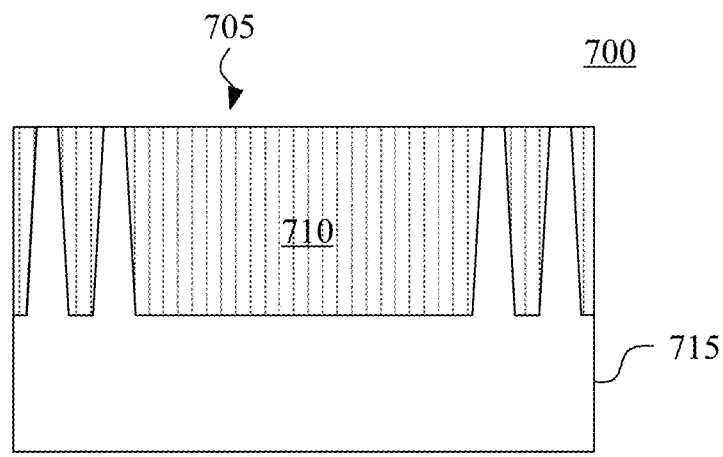
FIGS. 7A-7F are exemplary cross-sectional diagrams of a first stage of the fabrication of the semiconductor device in accordance with various embodiments of the present disclosure.

With reference to the method 600 in FIG. 6 and FIG. 7A, in operation 605, a shallow trench isolation (STI) structure 705 is formed, for illustration, on a semiconductor substrate

715. For illustration in FIG. 7A, the shallow trench isolation structure 705 includes at least one trench 710 that is filled with dielectric material.

For illustration of the method 600 in FIG. 6, in operation 610, a buried metal line BML is formed partially within the trench 710, as will be discussed with reference to FIGS. 7B-7F.

Figure 7B:
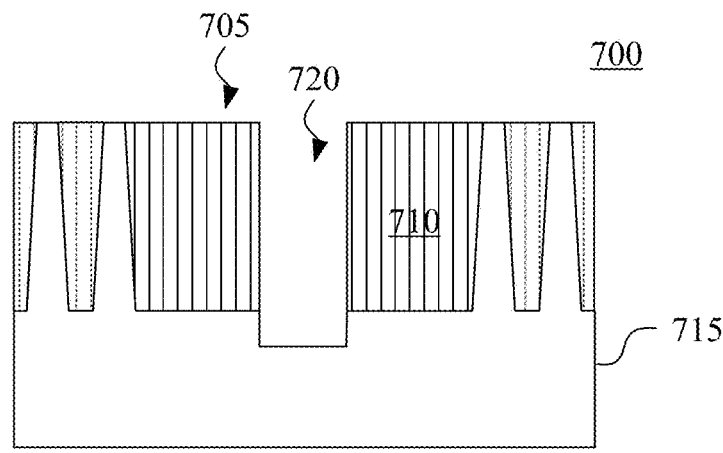
Figure 7C:
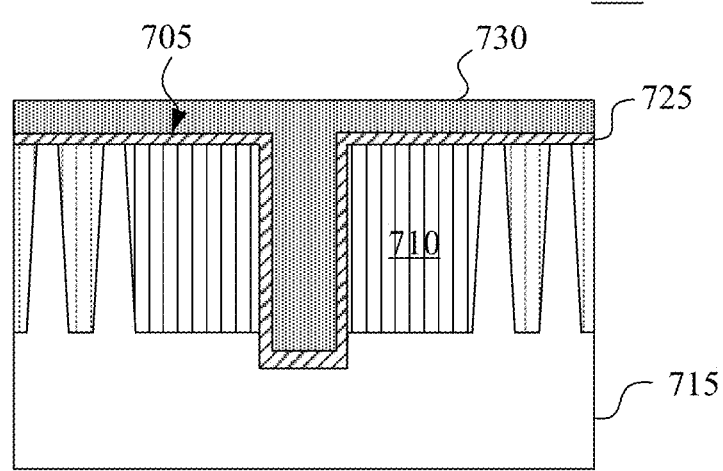

As illustratively shown in FIG. 7B, a portion of the dielectric material in the trench 710 is etched to form a recess 720. Furthermore, as illustratively shown in FIG. 7C, a liner deposition is performed to deposit a barrier layer 725 in the recess 720. In some embodiments, the barrier layer 725 is also deposited over the shallow trench isolation structure 705 as shown in FIG. 7C. For illustration in FIG. 7C, the recess 720 with the barrier layer 725 is filled with metal material 730 subsequently. In some embodiments, the metal material 730 is formed over the shallow trench isolation structure 705 as shown in FIG. 7C.

Figure 7D:
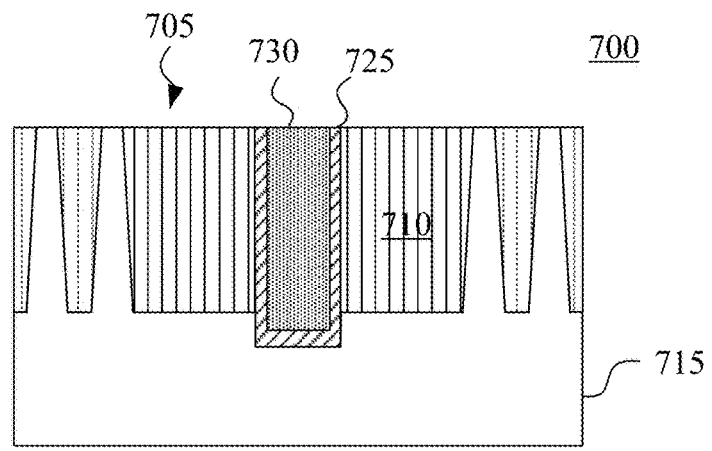

As illustratively shown in FIG. 7D, a portion of the barrier layer 725 and a portion of the metal material 730, which are formed above the shallow trench isolation structure 705, are removed.

Figure 7E:
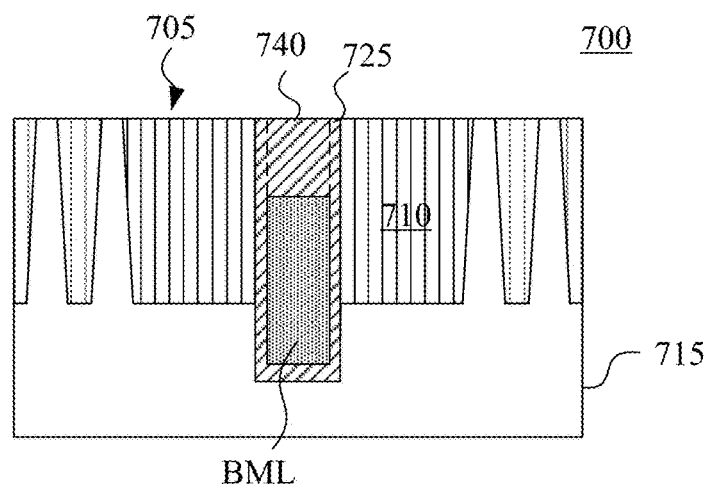

As illustratively shown in FIG. 7E, a top portion of the metal material 730 in FIG. 7D is removed to form the buried metal line BML. Then, a dielectric material is formed on the buried metal line BML to form a capped barrier layer 740. In some embodiments, the capped barrier layer 740 is formed for electrical and/or physical isolation. In some embodiments, the dielectric material, which is formed on the buried metal line BML, includes the material as same as the dielectric material in the trench 710 as discussed above. In some embodiments, the material of the capped barrier layer 740 includes SiOx, SiN, SiC, SiON, SiOC, SiONC, or a combination thereof.

Figure 7F:
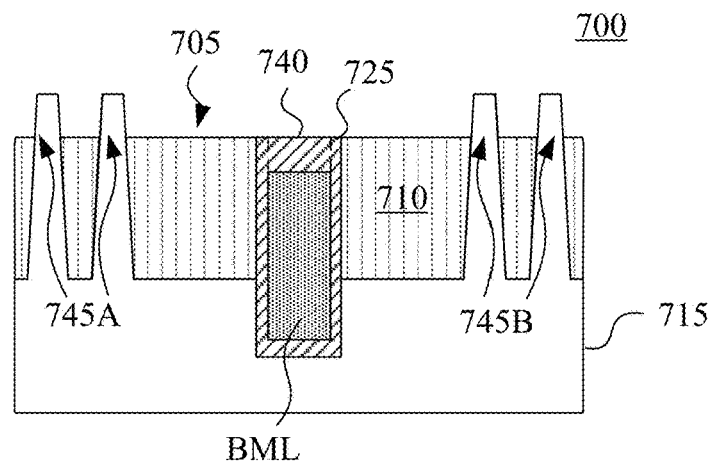

As illustratively shown in FIG. 7F, an upper portion of the dielectric material in the trench 710 and the capped barrier layer 740 is removed to form the fin components 745A and 745B.

Figure 8A:
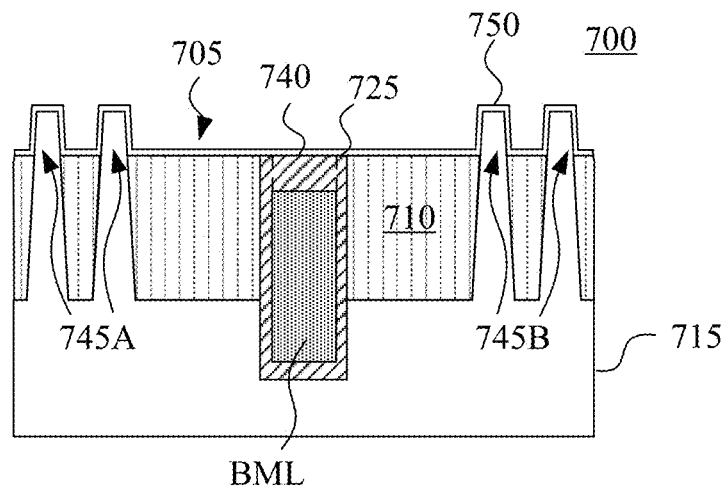
FIGS. 8A-8E are exemplary cross-sectional diagrams of a second stage of the fabrication of the semiconductor device in accordance with various embodiments of the present disclosure.

For illustration of the method 600 in FIG. 6, in operation 615, an electrical component, e.g., a metal gate structure 750, is formed on the shallow trench isolation structure 705, as illustrated in FIG. 8A. For illustration in FIG. 8A, the metal gate structure 750 covers the fin components 745A and 745B.

For illustration of the method 600 in FIG. 6, in operation 620, metal segments 780 and 785 are formed over the metal gate structure 750, as will be discussed with reference to FIGS. 8B-8E.

Figure 8B:
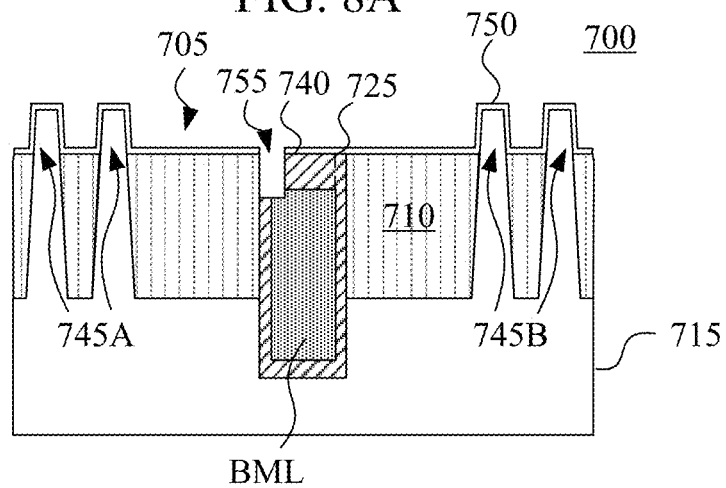

As illustratively shown in FIG. 8B, the metal gate structure 750 and the capped barrier layer 740 right above the buried metal line BML are etched to form a recess 755 to partially expose the buried metal line BML.

Figure 8C:
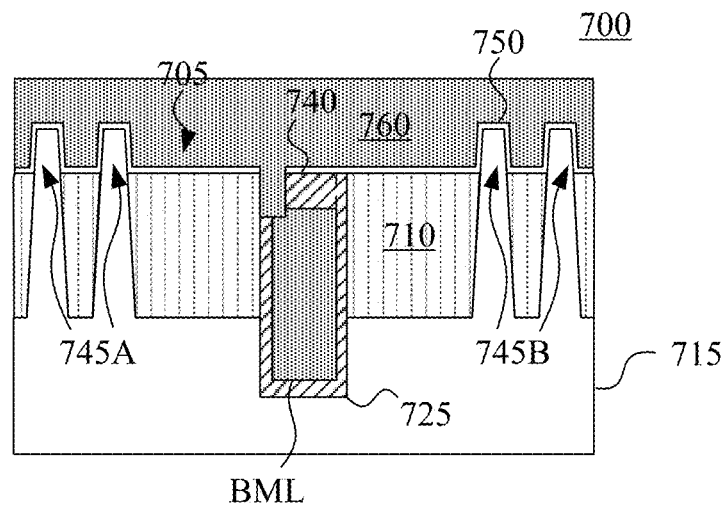
Figure 8D:
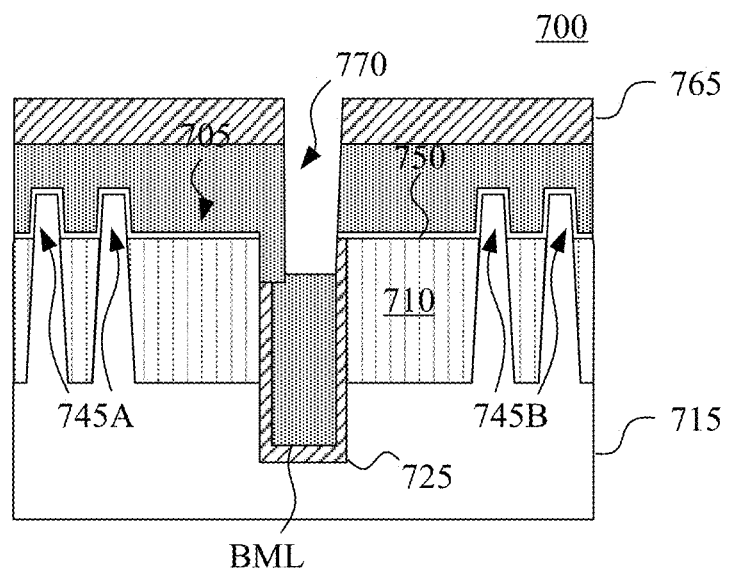

As illustratively shown in FIG. 8C, metal material 760 is filled in the recess 755 and over the metal gate structure 750. Furthermore, as illustratively shown in FIG. 8D, a top barrier layer 765 is formed over the metal material 760. After the top barrier layer 765 is formed, a portion of the top barrier layer 765 and a portion of the metal material 760 are etched subsequently to form a recess 770, as illustratively shown in FIG. 8D. In some embodiments, the recess 770 separates the metal material 760 into two metal segments 780 and 785, as illustratively shown in FIG. 8E, in which a portion of the metal segment 780 extends to the trench 710 to be electrically coupled to the buried metal line BML.

Figure 8E:
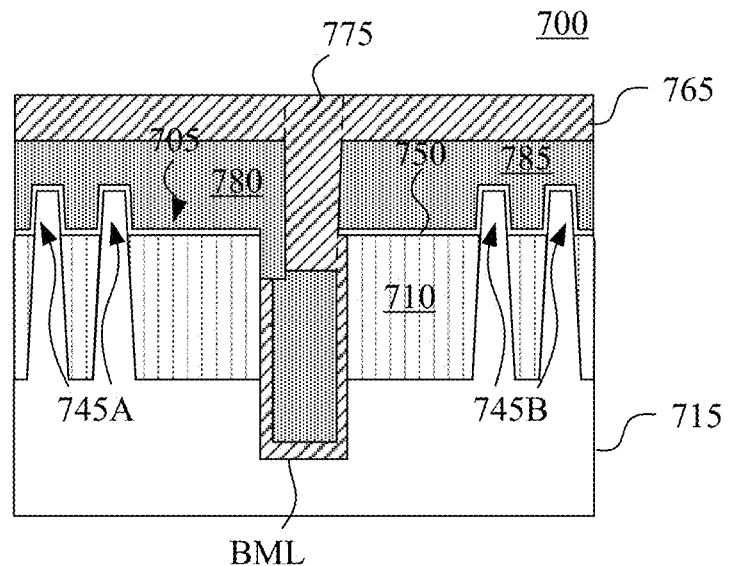

As illustratively shown in FIG. 8E, dielectric material is filled in the recess 770 to form an isolation barrier structure 775 contacting the buried metal line BML. The isolation barrier structure 775 electrically isolates the two metal segments 780 and 785 from each other.

In some embodiments, the semiconductor device 700 shown in FIG. 8E corresponds to a portion of the semiconductor device 100 in FIGS. 2A-2C. In some embodiments, the semiconductor device 700 shown in FIG. 8E indicates a cross section of the structure corresponding to the gate 210 in FIGS. 2A-2C.

Figure 9A:
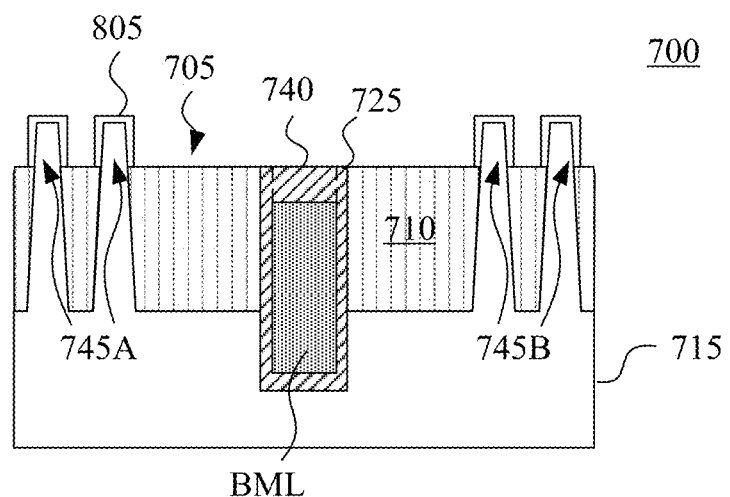
FIGS. 9A-9D are exemplary cross-sectional diagrams of a second stage of the fabrication of the semiconductor device in accordance with alternative embodiments of the present disclosure.

For another illustration of the method 600 in FIG. 6, in operation 615, another electrical component, e.g., source/drain structure 805, is formed on the fin components 745A and 745B, respectively, as illustrated in FIG. 9A. For simplicity, only one reference number 805 is shown in FIG. 9A.

For illustration of the method 600 in FIG. 6, in operation 620, a metal segment 820 is formed over the source/drain structure 805, as will be discussed with reference to FIGS. 9B-9D.

Figure 9B:
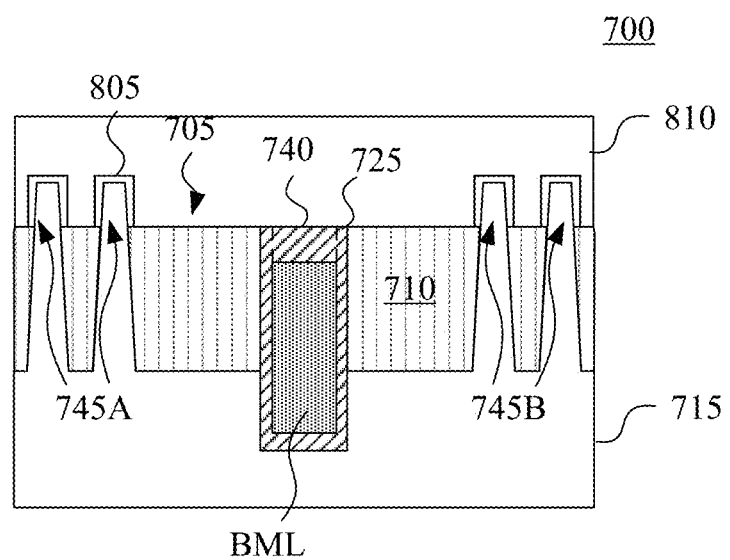

As illustratively shown in FIG. 9B, an interlayer dielectric portion 810 is formed over the shallow trench isolation structure 705 and the source/drain structure 805.

Figure 9C:
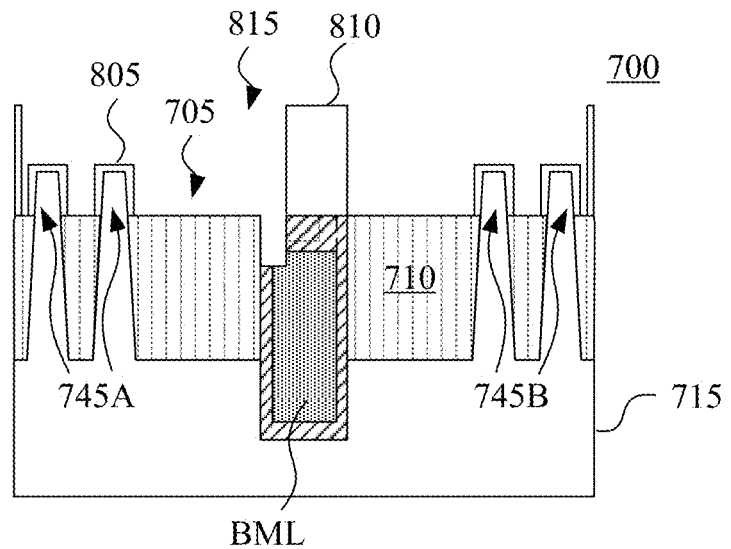

As illustratively shown in FIG. 9C, the interlayer dielectric portion 810 is etched to form a recess 815 to expose the source/drain structure 805, a portion of the shallow trench isolation structure 705, and a portion of the buried metal line BML.

Figure 9D:
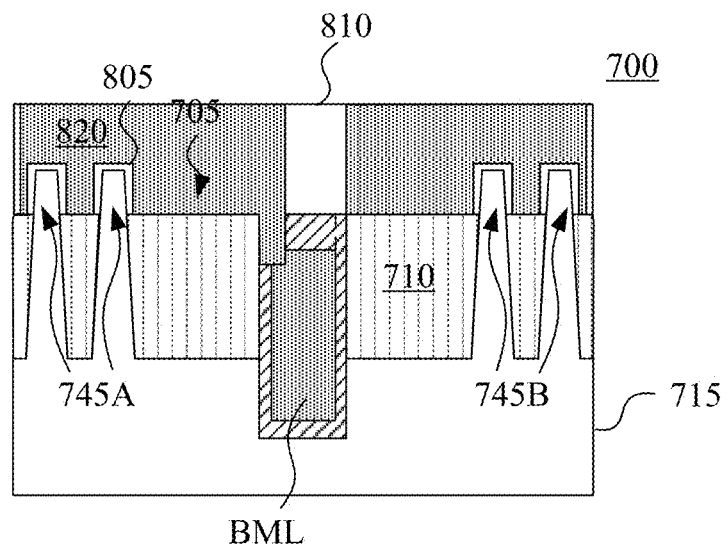

As illustratively shown in FIG. 9D, metal material is filled in the recess 815 to form the metal segment 820. For illustration, the metal segment 820 is formed laterally with respect to the interlayer dielectric portion 810 remained after being etched, and the metal segment 820 covers the source/drain structure 805. Moreover, a portion of the metal segment 820 extends to the trench 710 to be electrically coupled to the buried metal line BML.

In some embodiments, the semiconductor device 700 shown in FIG. 9D corresponds to a portion of the semiconductor device 100 in FIGS. 2A-2C. In some embodiments, the semiconductor device 700 shown in FIG. 9D indicates a cross section of the structure corresponding to the portion along the line A-A in FIGS. 2A-2C.

Figure 10:
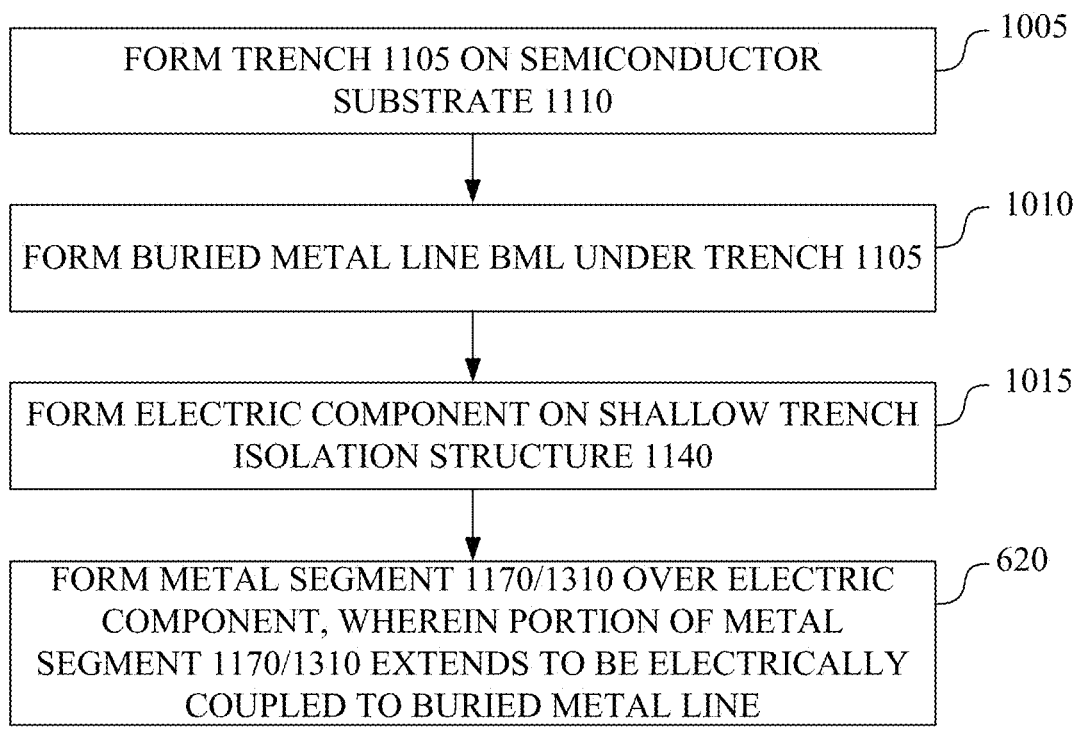
FIG. 10 is a flow chart of another method illustrating the fabrication process of a semiconductor device having a buried metal line in accordance with some embodiments of the present disclosure.

FIG. 10 is a flow chart of another method 1000 illustrating a fabrication process of a semiconductor device having a buried metal line in accordance with various embodiments of the present disclosure.

Figure 12A:
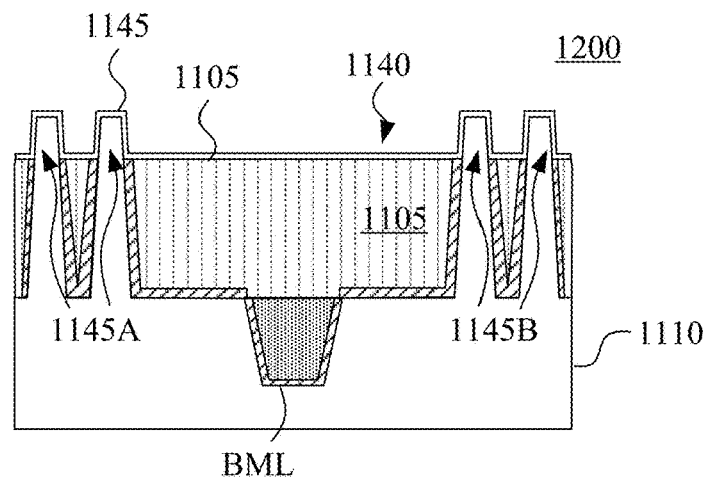
FIGS. 12A-12C are exemplary cross-sectional diagrams of a second stage of the fabrication of the semiconductor device in accordance with various embodiments of the present disclosure.
Figure 12B:
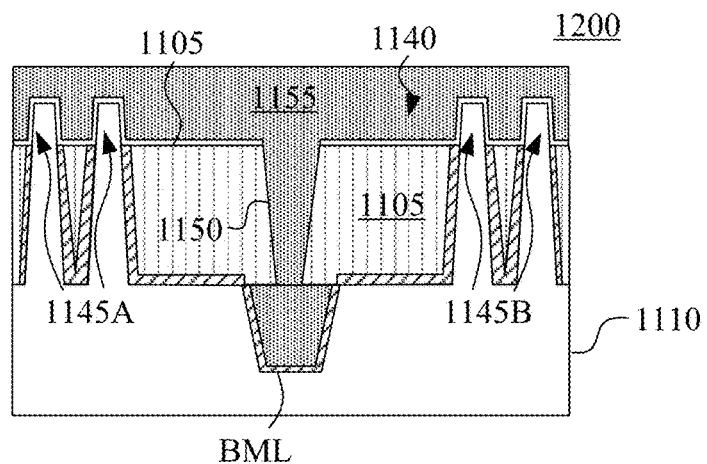
Figure 12C:
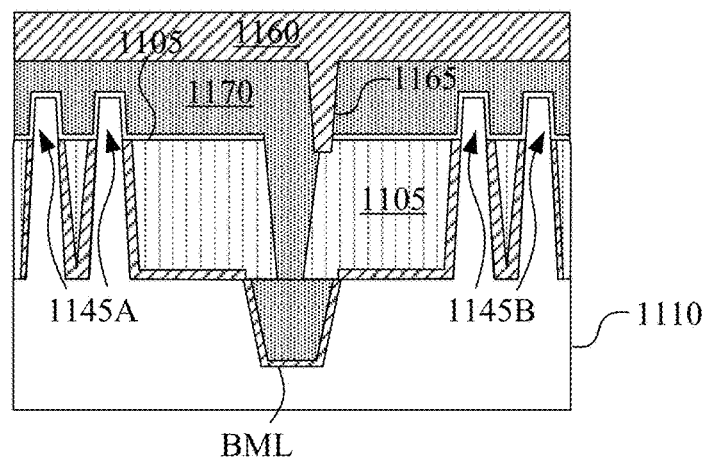
Figure 13A:
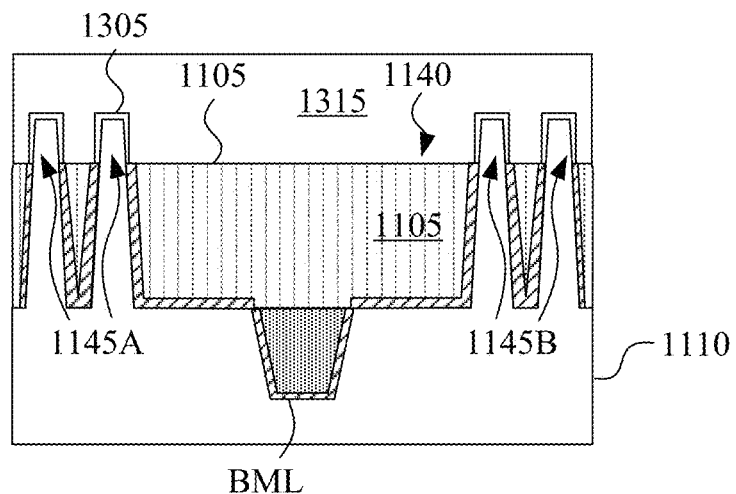
FIGS. 13A-13B are exemplary cross-sectional diagrams of a second stage of the fabrication of the semiconductor device in accordance with alternative embodiments of the present disclosure.
Figure 13B:
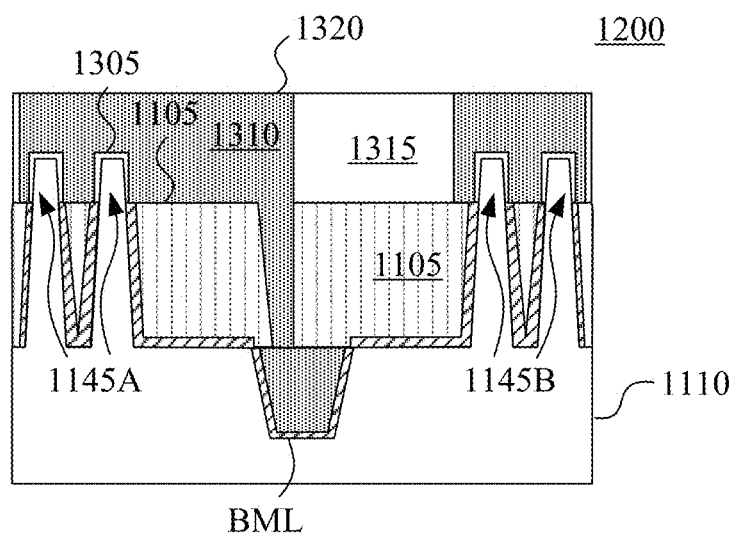

FIGS. 11A-11D are exemplary cross-sectional diagrams of a first stage of the fabrication of a semiconductor device 1200 in accordance with various embodiments of the present disclosure. FIGS. 12A-12C are exemplary cross-sectional diagrams of a second stage of the fabrication of the semiconductor device 1200 in accordance with various embodiments of the present disclosure. FIGS. 13A-13B are exemplary cross-sectional diagrams of a second stage of the fabrication of the semiconductor device 1200 in accordance with alternative embodiments of the present disclosure.

For illustration, the method 1000 is applied to the semiconductor device 1200 illustrated in FIGS. 11A-11D, 12A-12C, and 13A-13B. The method 1000 discussed below with reference to FIGS. 11A-11D, 12A-12C, and 13A-13B is given for illustrative purposes. Various semiconductor devices formed by using the method 1000 are within the contemplated scope of the present disclosure.

Figure 11A:
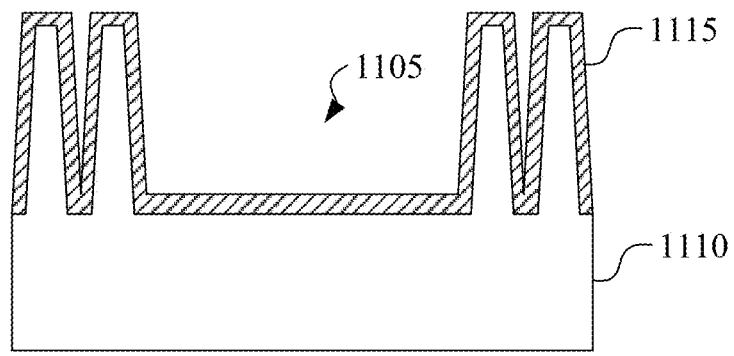
FIGS. 11A-11D are exemplary cross-sectional diagrams of a first stage of the fabrication of the semiconductor device in accordance with various embodiments of the present disclosure.

For illustration of the method 1000 in FIG. 10 and FIG. 11A, in operation 1005, at least one trench 1105 is formed on a semiconductor substrate 1110.

For illustration of the method 1000 in FIG. 10 and FIG. 11A to FIG. 11D, in operation 1010, the buried metal line BML is formed under the trench 1105, as will be discussed with reference to FIGS. 11B-11D.

As illustratively shown in FIG. 11A, a liner deposition is performed to deposit a barrier layer 1115 over the trench 1105.

Figure 11B:
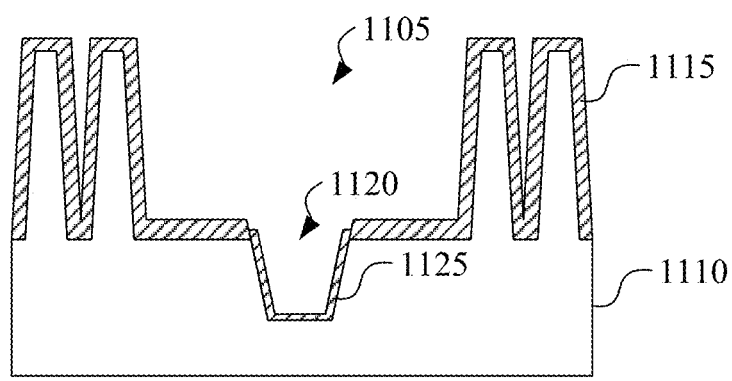

As illustratively shown in FIG. 11B, a portion of the barrier layer 1115 and the semiconductor substrate 1110 is etched to form a recess 1120. Subsequently, a liner deposition is performed to deposit a barrier layer 1125 in the recess 1120.

Figure 11C:
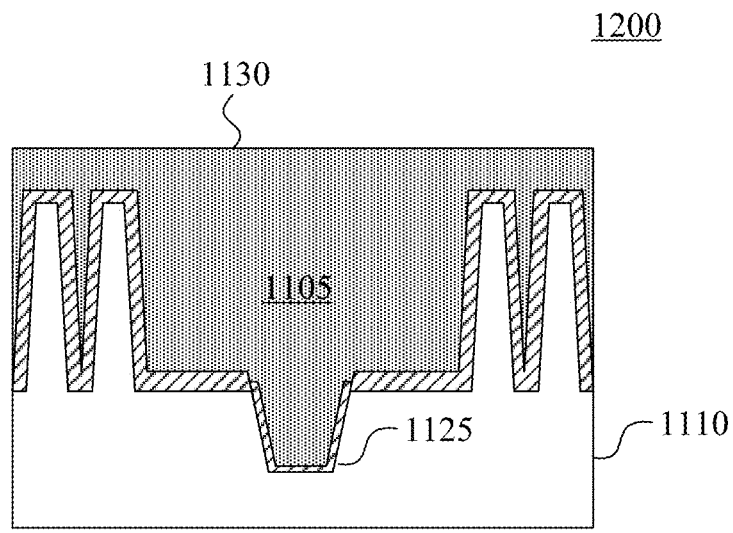

As illustratively shown in FIG. 11C, the recess 1120 is filled with metal material 1130 covering the barrier layer 1125. In some embodiments, the metal material 1130 is formed over other components on the semiconductor substrate 1110 at the same time as shown in FIG. 11C.

Figure 11D:
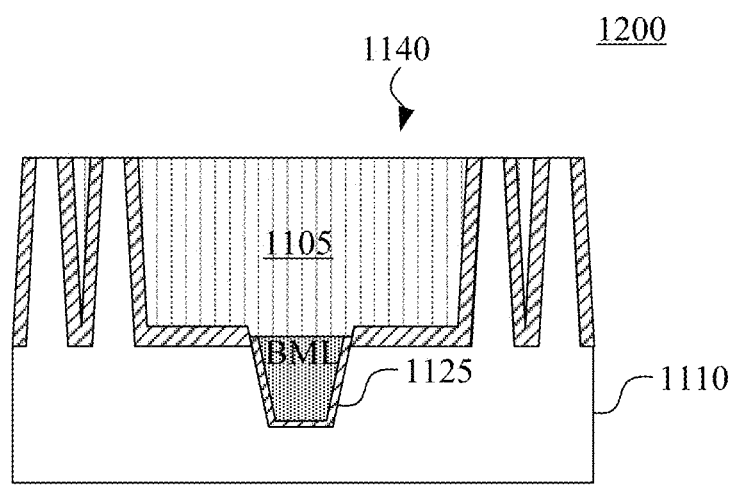

As illustratively shown in FIG. 11D, the upper portion of the metal material 1130 in FIG. 11C is removed. The remained portion of the metal material 1130 forms the buried metal line BML. Subsequently, the trench 1105 is filled with dielectric material to form a shallow trench isolation (STI) structure 1140.

With reference to the method 1000 in FIG. 10 and FIG. 12A, in operation 1015, an electrical component, e.g., a metal gate structure 1145, is formed on the shallow trench isolation structure 1140.

As illustratively shown in FIG. 12A, the dielectric material is etched to form fin components 1145A and 1145B. Subsequently, the metal gate structure 1145 is formed on the shallow trench isolation structure 1140. For illustration in FIG. 12A, the metal gate structure 1145 covers the fin components 1145A and 1145B.

As illustratively shown in FIG. 12B, the dielectric material is etched to form a recess 1150 partially exposing the buried metal line BML. Subsequently, metal material 1155 is filled in the recess 1150. In some embodiments, the metal material 1155 is formed over other components on the semiconductor substrate 1110 at the same time.

As illustratively shown in FIG. 12C, a top barrier layer 1160 is formed over the metal material 1155. Further, an isolation barrier structure 1165 is subsequently formed to extend through the metal material 1155 such that the separated metal material electrically coupled to the buried metal line BML becomes the metal segment 1170.

In some embodiments, the semiconductor device 1200 formed in FIG. 12C corresponds to a portion of the semiconductor device 100 in FIGS. 2A-2C. In some embodiments, the semiconductor device 800 shown in FIG. 12C indicates a cross section of the structure corresponding to the gate 210 in FIGS. 2A-2C.

With reference to the method 1000 in FIG. 10 and FIG. 13A, in operation 1015, another electrical component, e.g., a source/drain structure 1305, is formed on the fin components 1145A and 1145B, respectively. For simplicity, only one reference number 1305 is shown in FIG. 13A.

With reference to the method 1000 in FIG. 10 and FIG. 13B, in operation 1020, a metal segment 1310 is formed partially over the source/drain structure 1305.

As illustratively shown in FIG. 13A, an interlayer dielectric portion 1315 is formed over the shallow trench isolation structure 700 and the source/drain structure 1305.

As illustratively shown in FIG. 13B, the interlayer dielectric portion 1315 is etched to form a recess 1320 to expose the source/drain structure 1305, a portion of the shallow trench isolation structure 1305, and a portion of the buried metal line BML. Subsequently, metal material is filled in the recess 1320 to respectively form the metal segment 1310. For illustration, the metal segment 1310 is formed laterally with respect to the interlayer dielectric portion 1315 remained after being etched, and the metal segment 1310 covers the source/drain structure 1305. Moreover, a portion of the metal segment 1310 extends to the trench 1105 to be electrically coupled to the buried metal line BML.

In some embodiments, the semiconductor device 1200 shown in FIG. 13B corresponds to a portion of the semiconductor device 100 in FIGS. 2A-2C. In some embodiments, the semiconductor device 1300 shown in FIG. 13B indicates a cross section of the structure corresponding to the portion along the line A-A in FIGS. 2A-2C.

The number and the order of the operations illustrated in FIG. 6 and FIG. 10 are given for illustrative purposes. Various numbers and the orders of the operations are within the contemplated scope of the present disclosure.

In some embodiments, a method includes etching a semiconductor substrate to form a fin. An isolation structure is formed over the semiconductor substrate and around the fin. The isolation structure and the semiconductor substrate are etched to form a recess. A barrier layer is deposited over a bottom surface and a sidewall of the recess. A conductive layer is deposited over the barrier layer. The conductive layer is recessed to form a conductive line, in which a top surface of the conductive line is lower than a top surface of the isolation structure. A dielectric cap layer is formed over the conductive line. The isolation structure and the dielectric cap layer are recessed, such that the fin protrudes from the recessed isolation structure.

In some other embodiments, a method includes etching a semiconductor substrate to form a fin. The semiconductor substrate is etched to form a recess adjacent to the fin. A first barrier layer is deposited over a bottom surface and a sidewall of the recess. A conductive layer is deposited over the first barrier layer. The conductive layer is recessed to form a conductive line, in which a top surface of the conductive line is lower than a top surface of the fin. An isolation structure is formed over the conductive line and around the fin. The isolation structure is recessed, such that the fin protrudes from the recessed isolation structure.

In some other embodiments, a method includes etching a semiconductor substrate to form a fin. A metal line is at least partially formed in the semiconductor substrate and adjacent to the fin. An isolation structure is formed over the metal line. A gate dielectric layer is deposited over the fin and the isolation structure. The gate dielectric layer and the isolation structure are etched to expose the metal line. A metal gate structure is formed over the gate dielectric layer, in which a portion of the metal gate structure lands on the exposed metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   etching a semiconductor substrate to form a fin;
   forming an isolation structure over the semiconductor substrate and around the fin;
   etching the isolation structure and the semiconductor substrate to form a recess;

depositing a barrier layer over a bottom surface and a sidewall of the recess;

depositing a conductive layer over the barrier layer;

recessing the conductive layer to form a conductive line, wherein a top surface of the conductive line is lower than a top surface of the isolation structure;

forming a dielectric cap layer over the conductive line; and recessing the isolation structure and the dielectric cap layer, such that the fin protrudes from the recessed isolation structure.

2. The method of claim 1, further comprising:
depositing a glue layer over the barrier layer prior to depositing the conductive layer.

3. The method of claim 2, wherein the glue layer comprises tungsten, tantalum, titanium, titanium nitride, tantalum nitride, or combinations thereof.

4. The method of claim 1, wherein the barrier layer comprises a dielectric material.

5. A method, comprising:
etching a semiconductor substrate to form a fin;
etching the semiconductor substrate to form a recess adjacent to the fin;
depositing a first barrier layer over a bottom surface and a sidewall of the recess;
depositing a conductive layer over the first barrier layer;
recessing the conductive layer to form a conductive line, wherein a top surface of the conductive line is lower than a top surface of the fin;
forming an isolation structure over the conductive line and around the fin; and
recessing the isolation structure, such that the fin protrudes from the recessed isolation structure.

6. The method of claim 5, further comprising:
depositing a second barrier layer over the fin prior to etching the semiconductor substrate to form the recess.

7. The method of claim 5, further comprising:
forming a source/drain structure over the fin;
depositing an interlayer dielectric layer over the source/drain structure;
etching the interlayer dielectric layer and the isolation structure to expose the source/drain structure and the conductive line; and
forming a contact over the exposed source/drain structure, wherein a portion of the contact lands on the exposed conductive line.

8. A method, comprising:
etching a semiconductor substrate to form a fin;
forming a shallow trench isolation (STI) structure around the fin;
etching the STI structure to form a recess in the STI structure;
forming a metal line in the recess in the STI structure and a dielectric cap layer atop the metal line; and
after forming the metal line, recessing the STI structure to expose sidewalls of the fin.

9. The method of claim 8, further comprising:
etching the semiconductor substrate to extend the recess into the semiconductor substrate before forming the metal line.

10. The method of claim 8, wherein forming the metal line comprises:
depositing a barrier layer to line the recess in the STI structure; and
after depositing the barrier layer, filling the recess with a metal material.

11. The method of claim 10, wherein forming the metal line further comprises:
removing a portion of the barrier layer and a portion of the metal material from above the fin and the STI structure.

12. The method of claim 10, wherein forming the metal line further comprises:
recessing the metal material until a top surface of the metal material is lower than a top surface of the barrier layer.

13. The method of claim 12, wherein the dielectric cap layer is formed after recessing the metal material.

14. The method of claim 8, wherein the dielectric cap layer remains atop the metal line after recessing the STI structure.

15. The method of claim 8, wherein the dielectric cap layer is recessed simultaneously with recessing the STI structure.

16. The method of claim 8, further comprising:
after recessing the STI structure, etching the dielectric cap layer to expose the metal line; and
after etching the dielectric cap layer, forming a metal material that extends upwardly from the metal line to a position higher than a top surface of the fin.

17. The method of claim 16, wherein forming the metal material is performed such that the metal material extends laterally across the fin.

18. The method of claim 16, wherein etching the dielectric cap layer is performed such that a top corner portion of the metal line is removed.

19. The method of claim 16, further comprising:
etching the metal material to separate the metal material into metal segments; and
forming an isolation structure between the metal segments.

20. The method of claim 19, wherein etching the metal material is performed such that the dielectric cap layer is removed.

* * * * *